United States Patent [19]
Davis et al.

[11] Patent Number: 5,325,383
[45] Date of Patent: Jun. 28, 1994

[54] LASER DIODE OPERATED IN HYBRID MODULATION MODES

[75] Inventors: James G. Davis; James A. Hardy, both of Rochester, N.Y.

[73] Assignee: Eastman Kodak Company, Rochester, N.Y.

[21] Appl. No.: 61,944

[22] Filed: May 17, 1993

[51] Int. Cl.$^5$ .............................................. H01S 3/10
[52] U.S. Cl. ........................................ 372/26; 372/9; 372/38; 372/29; 346/108
[58] Field of Search .................... 372/9, 26, 38, 29; 346/108

[56] References Cited

U.S. PATENT DOCUMENTS

| | | | |
|---|---|---|---|
| 4,375,065 | 2/1983 | Ohara | 346/108 |
| 4,679,057 | 7/1987 | Hamada | 346/76 |
| 4,754,291 | 6/1988 | Horikawa | 346/108 |
| 4,774,710 | 9/1988 | Davis et al. | 372/9 |
| 4,799,069 | 1/1992 | Sasaki et al. | 346/108 |
| 4,806,946 | 2/1989 | Ohnishi | 346/1.1 |
| 4,905,022 | 2/1990 | Nagasawa | 346/108 |
| 4,987,426 | 1/1991 | Ota et al. | 346/108 |

OTHER PUBLICATIONS

"Uniform Perceptual Quantization: Applications to Digital Radiography," M. I. Sezan, K. Yip, S. J. Daly, IEEE Transactions on Systems, Man, and Cybernetics, vol. SMC-17, No. 4, Jul./Aug. 1987, pp. 622-634.

Primary Examiner—Georgia Y. Epps
Attorney, Agent, or Firm—William F. Noval

[57] ABSTRACT

A laser imaging apparatus includes a laser diode which is controlled to produce a laser beam the power of which varies linearly as a function of a digital image input signal. The laser beam is deflected by scanning optics to expose photosensitive media such as film. When the digital image input signal is in a first range of values to operate the laser diode in its linear region, the laser diode is controlled to operate in an amplitude modulation mode. When the digital image input signal is in a second, lower, range of values which would operate the laser diode in its non-linear operating region, the laser diode is controlled to operate in the linear region but in a pulse amplitude modulation mode.

7 Claims, 9 Drawing Sheets

LASER DIODE OPERATED IN HYBRID MODULATION MODES

TECHNICAL FIELD

In general, the present invention relates to laser imaging apparatus such as laser printer apparatus. More particularly, the present invention relates to laser diode printer apparatus wherein the exposure characteristics of a laser diode are optimized so that the maximum range of exposure (Emax -Emin) is obtained without the use of the light emitting diode (LED) region of the laser diode.

BACKGROUND ART

Figure 1:
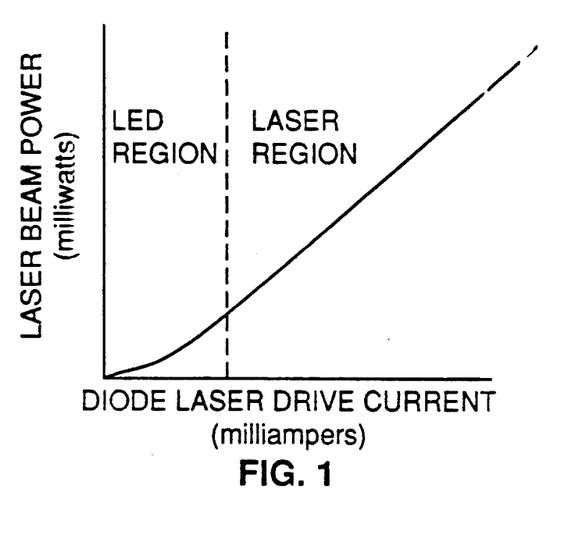
FIG. 1 is a graphical view illustrating the operating curve of a laser diode.

A laser diode operates in two distinct regions which includes a laser region and a LED region. As shown in FIG. 1, the laser region is characterized by a linear relationship between the laser diode drive current above a threshold current, and the output illuminative power. In the LED region, the relationship between the drive current and the output illuminative power is non-linear, and the change in output illuminative power is very small for a change in current, relative to the laser region of operation. A means of using laser diodes for exposure in laser printers, is to drive the laser diode with a digital to analog converter (DAC) which equally divides the current into $2^N-1$ values, where N equals the number of bits input to the DAC. Because the laser diode efficiency (which is measured as milliwatts output power, per unit milliamp of input current) is very small in the LED region, a large range of input signal code values results in very little change in exposure.

One type of laser printer uses an n bit (e.g., 12 bit) DAC which drives an exposure device (a He-Ne gas laser and acoustooptic modulator or laser diode). The exposure device then prints exposures upon photosensitive media such as film. An output lookup table is constructed, through which the data is mapped prior to digital to analog conversion. The lookup table is calculated to force a linear mapping from code value to film density.

In the high density region of the Density vs. Log Exposure (D LogE) film curve, the delta exposure for a constant delta density is much greater than in the low density region. As a result, the output lookup table maps a number of input code values to a single output code value in the high density or high exposure region. This results in an inefficient use of code values for exposure.

It is known that the threshold of visibility for a small change in luminance is relatively constant in the luminance region over which radiographs are viewed (see M I Sezan, K. Yip, S.J. Daly, "Uniform Perceptual Quantization: Applications to Digital Radiography," IEEE Transactions on Systems, Man, and Cybernetics, Vol. SMC-17, No. 4, Jul/Aug 1987, pp. 622–634). Because this delta luminance parameter is related by a constant factor to delta density, the optimum laser printer would use an exposure means which, in a monotonically increasing manner, maps each code value to a unique density value, and for which delta density is a constant. Thus, based upon the D LogE curve of the film, the optimum code value to exposure curve can be calculated.

The multimode behavior of the laser diode in the LED region, in addition to the low efficiency, make the LED region undesirable for exposure. In the LED region, the wavelength is lower than in the laser region, and much of the illuminative power is not at the fundamental mode of operation. Since the density of exposed and developed film is dependent upon the wavelength of exposure, the change in wavelength adds an additional source of error in the exposure process.

In U.S. Pat. No. 4,774,710, issued Sep. 27, 1988, inventors Davis and Hardy (see also U.S. Pat. No. 4,987,426, issued Jan. 22, 1991, inventors Ota et al.), it was suggested that at power levels below a cutoff point chosen to be in the laser region of operation, but just above the transition to the LED region, the laser be pulse width modulated to linearly extend the exposure to a minimum exposure level. The implementation of this idea requires that in the pulse width modulation region, the division of the pixel period be divided into pulse widths on the order of several nanoseconds. If a pixel is 182 nanoseconds, this implies the smallest pulse width be 1 nanosecond. At present this is not realizable in a cost effective manner with the state of the art in electronic components.

The following patents, which have also disclosed the use of multiple modulation modes in laser recording systems, have not been completely successful in maximizing the exposure range of the laser and in reusing the laser region of a laser diode. U.S. Pat. No. 4,799,069, issued Jan. 17, 1989, inventors Sasaki et al.; U.S. Pat. No. 4,806,946, issued Feb. 21, 1989, U.S. Pat. No. 4,375,065, issued Feb. 22, 1983, inventor Ohara; U.S. Pat. No. 4,905,022, issued Feb. 27, 1990, inventor Nagashawa; U.S. Pat. No. 4,754,291, issued Jun. 29, 1988, inventor Horikawa; U.S. Pat. No. 4,679,057, issued Jul. 7, 1987, for Laser Recording Apparatus.

Thus, there exists in known laser diode printer apparatus the problem of expanding the exposure range of the laser diode without operating in the LED region of the laser diode.

SUMMARY OF THE INVENTION

According to the present invention, there is provided a solution to the problems of the prior art relating to laser diode printer apparatus wherein the linear laser region of operation of the laser diode is reused to increase the contrast ratio and exposure range and to minimize the undesirable effects of operating the laser diode in the non-linear operating region.

According to an aspect of the present invention a laser imaging apparatus comprises:

a laser diode which is operable in a linear laser region and a lower nonlinear LED region;

means for applying to said laser diode a digital image input signal having a first range of digital values which would operate said laser diode in said linear region and having second and third lower ranges of digital values below said first range of values which would operate said laser diode in said nonlinear region; and control means for controlling said laser diode to operate in an amplitude modulation mode in said linear operating region, when said digital image input signal has a value in said first range of digital values., to operate, in one of a pulse amplitude modulation mode (PAM), or a pulse width modulation (PWM) mode in said linear region, when said digital image input signal has a value in said second range of digital values, and to operate in the other of said PAM or PWM modes in said linear region when said digital input signal has a value in said third range of digital values.

According to a further aspect of the present invention laser imaging apparatus comprises:

a laser diode which is operable in a linear laser region and a lower nonlinear LED region;

means for applying to said laser diode a digital image input signal having a first range of digital values which would operate said laser diode in said linear region and having second and third lower ranges of digital values below said first range of values which would operate said laser diode in said nonlinear region; and control means for controlling said laser diode to operate in an amplitude modulation mode in said linear operating region, when said digital image input signal has a value in said first range of values, to operate, in one of a pulse amplitude modulation mode (PAM), or a pulse number modulation (PNM) mode in said linear region, when said digital image input signal has a value in said second range of values, and to operate in the other of said PAM or PNM modes in said linear region when said digital input signal has a value in said third range of values.

According to still a further aspect of the present invention, laser imaging apparatus comprises:

a laser diode which is operable in a linear laser region and a lower nonlinear LED region;

means for applying to said laser diode a digital image input signal having a first range of digital values which would operate said laser diode in said linear region and having second, third, and fourth lower ranges of digital values below said first range of values which would operate said laser diode in said nonlinear region; and control means for controlling said laser diode to operate in an amplitude modulation mode in said linear operating region, when said digital image input signal has a value in said first range of values, to operate, in one of a pulse amplitude modulation mode (PAM), a pulse width mode (PWM), or a pulse number modulation (PNM) mode in said linear region, when said digital image input signal has a value in said second range of values, to operate in another of said PAM, PWM or PNM modes in said linear region when said digital input signal has a value in said third range of values, and to operate in the last of said PAM, PWM, and PNW modes in said linear region, when said digital image input signal is.

DESCRIPTION OF THE PREFERRED EMBODIMENTS

Figure 2:
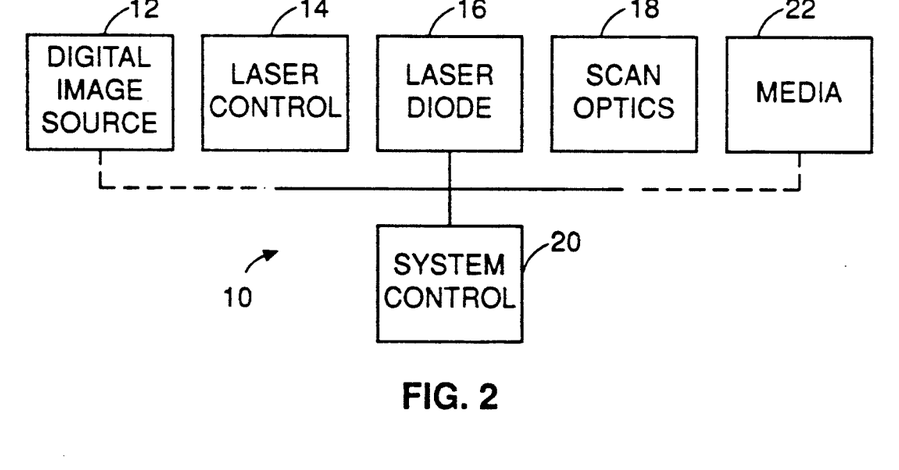
FIG. 2 is a block diagram of a laser imaging system including the present invention.

Referring now to FIG. 2, there is shown a laser imaging apparatus including an embodiment of the present invention. As shown, laser imaging apparatus 10 includes a digital image source 12, laser diode control 14, laser diode 16, scan optics 18, and system control 20. Digital image source 12 provides a digital image, such as a digital x-ray image, which is reproduced on photosensitive media 22 (such as film) by means of laser diode 16. Laser control 14 modulates laser diode 16 as a function of the digital image provided by source 12. Scan optics 18 scans the modulated laser beam onto media 22. System control 20 controls the operation of system 10.

Digital image source 12 may, for example, provide a digital x-ray image from (1) a medical imaging modality (CT, MRI, US, PET); (2) an x-ray film digitizer; (3) a storage phosphor system; (4) an image archival system (magnetic or optical).

Scan optics 18 shapes the laser beam from laser diode 16 and repetitively scans the laser beam onto media 22 as media 22 is moved past the scanning beam. Scan optics 18 may include an oscillating mirror, a rotating polygon mirror or a rotating holygon.

According to the present invention, the linear region of operation of the laser diode is reused to increase the contrast ratio and to reduce the undesirable effects associated with operating in the LED region of the laser. The invention increases contrast ratio by using amplitude modulation (AM) at high exposure levels and pulse modulation modes (PAM, PWM, PNM) at low exposure levels. The pulse modulation modes are used to force the operation of laser diode 16 to be in the laser region (as opposed to the LED region) at all times during exposure.

Figure 3A:
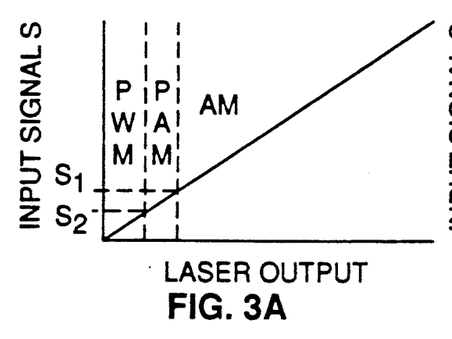
FIGS. 3A and 3B are input signal versus laser power output curves useful in explaining the operation of the respective embodiments shown in FIGS. 4A and 4B.

As shown in FIG. 3A in one embodiment of the invention, when the input digital signal from source 12 has a value in a first range of values which is greater than a first transition value $S_1$, the laser diode 16 is controlled by laser control 14 so that the input signal directly modulates laser diode 16 to produce an amplitude modulated laser beam. When the input signal from source 12 has a value in a second range of values which is equal to or less than the first predetermined transition value $S_1$ but which is above a second lower predetermined transition value $S_2$, then laser diode 16 is controlled by control 14 to operate in a pulse amplitude modulation mode at a laser power in the linear operating region.

When the input digital signal has a value in a third range of values below said second transition value $S_2$, the laser diode 16 is controlled by control 14 to operate in the linear region in a pulse width modulation mode.

Figure 3B:
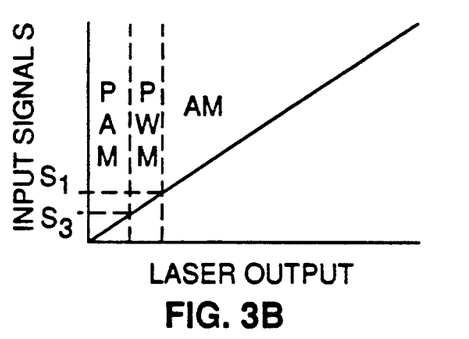

According to another embodiment of the invention as shown in FIG. 3B, when the digital image input signal has a value in a second lower range of values below the first transition value $S_1$, but above a second transition value $S_3$, the control means 14 controls laser diode 16 to operate in the linear region in a pulse width modulation mode. When the digital image input signal has a value in a third range of values below said second transition value, control means 14 controls laser diode 16 to operate in the linear region in a pulse amplitude mode.

Figure 4A:
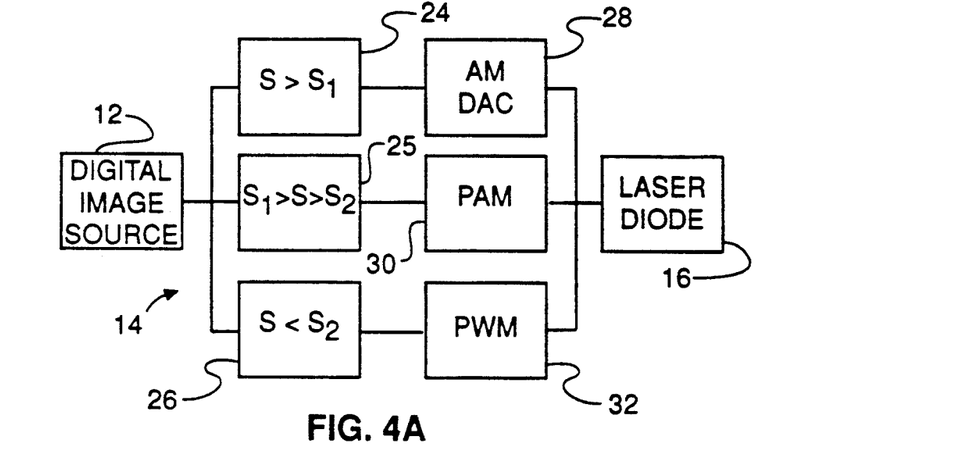
FIGS. 4A and 4B are block diagrams of one set of embodiments of the present invention.

FIG. 4A shows an embodiment of laser control 14 for controlling laser diode 16. As illustrated in FIG. 4A, laser control 14 includes comparators 24, 25 and 26, AM digital to analog converter (DAC) 28, pulse amplitude modulator (PAM) circuit 30 and pulse width modulator circuit (PWM) 32. Comparator 24 controls DAC 28 to modulate laser diode 16 in an AM mode when the digital signal S from source 12 has a value greater than $S_1$. Comparator 25 controls PAM circuit 30 to modulate laser diode 16 in a pulse amplitude modulation mode when the digital signal from source 12 is less than or equal to $S_1$, but greater than $S_2$. Comparator 26 controls PWM circuit 32 to modulate laser diode 16 in a pulse width mode when the digital signal from source 12 is less than or equal to $S_2$.

Figure 5A:
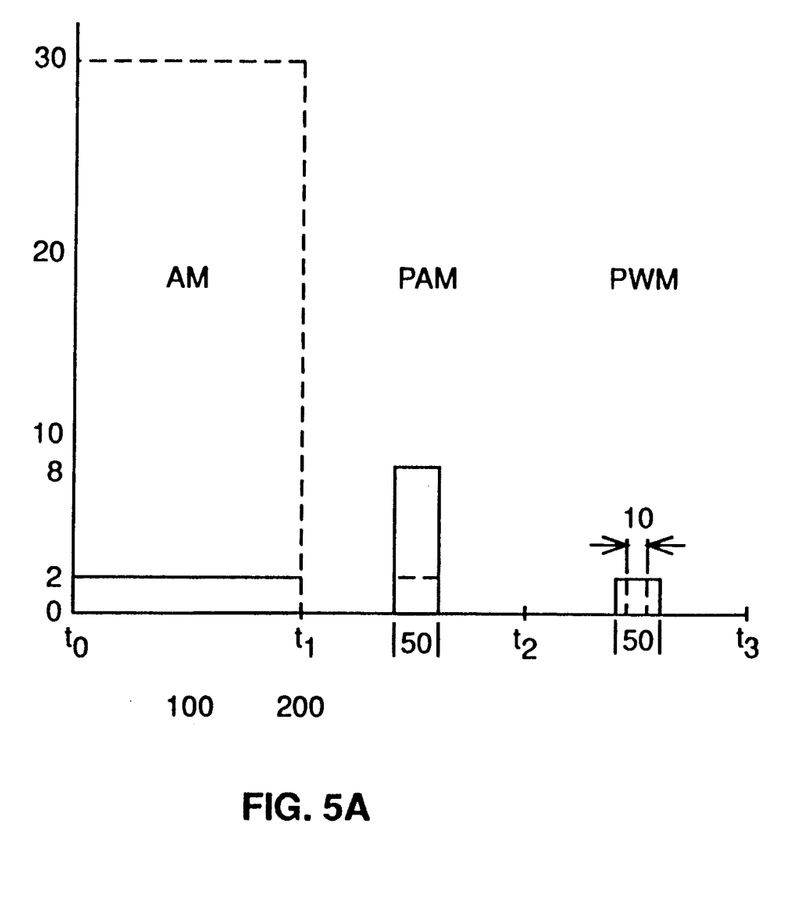
FIGS. 5A and 5B are graphical views useful in understanding the operation of the respective embodiments of FIGS. 4A and 4B.

The control signal used to control laser diode 16 is illustrated in FIG. 5A. During the pixel period, $t_0 \rightarrow t_1$, the signal from source 12 is greater than $S_1$ and therefore the control signal is a linear function of the input signal and amplitude modulates the laser diode 16. During the pixel period, $t_1 \rightarrow t_2$, the control signal pulse amplitude modulates the laser diode 16. During the period $t_2 \rightarrow t_3$, the control signal pulse width modulates the laser diode 16.

An example will be presented to illustrate the present invention. Assume that a laser diode 16 has a 30 milliwatt maximum continuous output. During the pixel period $t_0 \rightarrow t_1$, The laser diode operates in the laser mode of operation (i.e., amplitude modulation (AM)) and can have a value of from 2 milliwatts to 30 milliwatts. If a pixel has a period of 200 nanoseconds. In the linear region of operation a 15 to 1 contrast ratio can be realized. At 2 milliwatt output and below the contrast is increased by implementation of a pulse amplitude modulation and a pulse width modulation. To make a linear transition from the linear AM region to the pulse amplitude modulation region, the Pulse Width Amplitude Product (PWAP) is calculated for a pixel exposure which is at the threshold of change from AM to PAM. The PWAP must be matched to that of a pulse (or series of pulses) in a PAM pixel at the transition to PAM.

Continuing with the example, the amplitude of exposure power at the transition to PAM but still in AM is 2 milliwatts. This results in a PWAP=400 mW-nS.

Let the pulse amplitude (Apulse) at transition be 8 milliwatts, and use 1 pulse of amplitude 8 milliwatts, and period 50 nanoseconds. This results in a PWAP of 400 mW-nS, which is matched to the PWAP in the AM mode at the transition to the PAM mode. In the PAM mode of operation the contrast ratio 4 is the ratio of 8 to 2 milliwatts. The PAM mode is operated by reducing pulse amplitude to the minimum power level used for amplitude modulation (i.e. 2 milliwatts), but maintaining the pulse period at 50 nanoseconds. This implies an equivalent minimum exposure power of 2 mW × 1 pulse × 50 (nS/pulse) / 200 (nS/pixel) = 0.500 mW/pixel.

Exposure range is increased further by using PWM to effect lower power levels. Thus, at the transition from PAM to PWM, the pulse has an amplitude of 2 milliwatts and pulse period of 50 nanoseconds. During the pixel period $t_2 \rightarrow t_3$, for example, the pulse width can be reduced to 10 nanoseconds giving a further contrast ratio of 50/10=5. The minimum exposure power is $\frac{1}{5}$×0.500 mW/pixel=0.100 mW/pixel. The overall contrast ratio is 15×4×5=300=30 mW/pixel/0.100 mW/pixel.

Figure 4B:
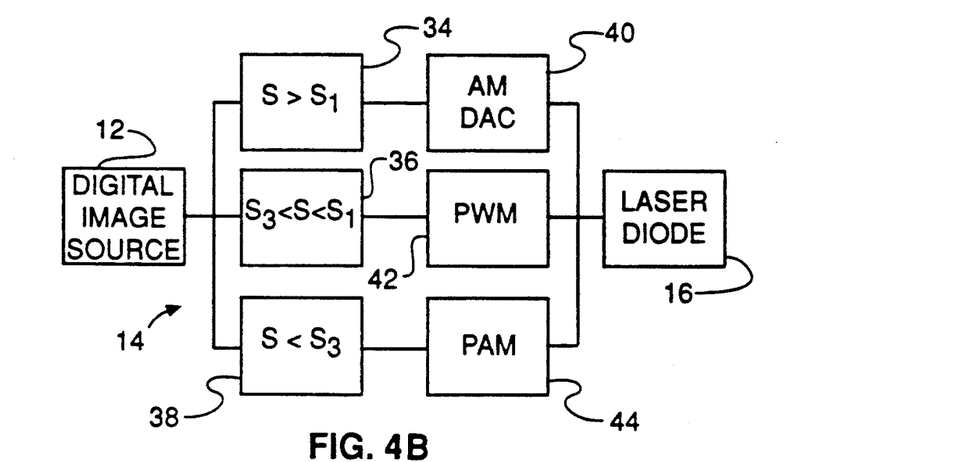

In the embodiment of FIG. 4B, laser control 14 includes comparators 34, 36 and 38, amplitude modulation (AM) DAC 40, PWM circuit 42 and PAM circuit 44. Comparator controls AM DAC 40 when the input digital signal S is greater than $S_1$, comparator 36 controls PWM circuit 42 when the input digital signal S is less than or equal to $S_1$ but greater than $S_3$, and comparator 38 controls PAM circuit 44 when the input digital signal S is less than or equal to $S_3$.

Figure 5B:
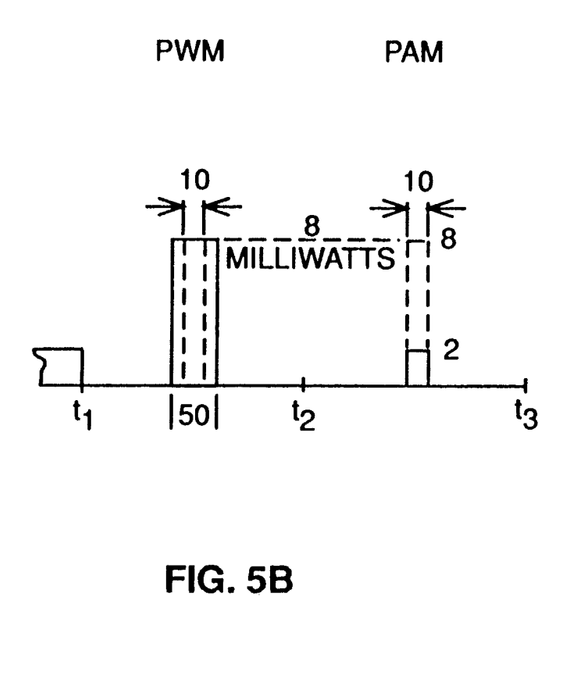
Figure 6:
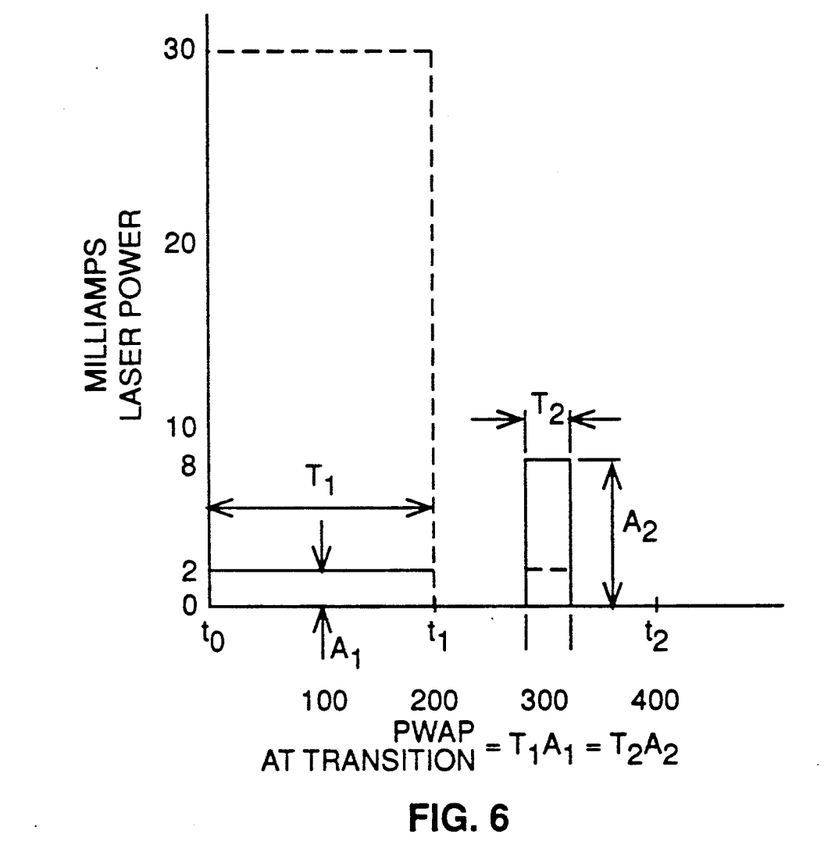
FIG. 6 is a graphical view useful in understanding the present invention.

The control signal used to control laser diode 16 is illustrated in FIG. 5B. During the pixel period, $t_0 \rightarrow t_1$, when the signal S is greater than $S_1$, the control signal amplitude modulates laser diode 16. During the pixel period $t_1 \rightarrow t_2$, when the signal S is between $S_1$ and $S_3$, the control signal pulse width modulates laser diode 16, when the signal S is less than $S_3$, the control signal pulse amplitude modulates laser diode 16.

Following through with the example given for FIG. 5A, FIG. 5B shows that for the pixel period $t_1 \rightarrow t_2$, the laser diode control signal has a pulse amplitude of 8 mw, but the pulse width is variable between 50 ns and 10 ns. During the pixel period $t_2 \rightarrow t_3$, the pulse width is 10 mg but the pulse amplitude varies between 8 mw and 2 mw. As with the embodiment of FIG. 4A, the contrast ratio of the embodiment of FIG. 4B is also 300. It should be noted that in both embodiments, the laser diode control current operates the laser diode 16 in its linear lasing region.

It is also within the scope of the invention to operate in the pulse amplitude mode using more than one pulse per pixel period. In the example given, for example, two pulses each having 25 nanoseconds period or five pulses each having 10 nanoseconds period, could be used in place of one pulse with a fifty nanosecond period.

Figure 7A:
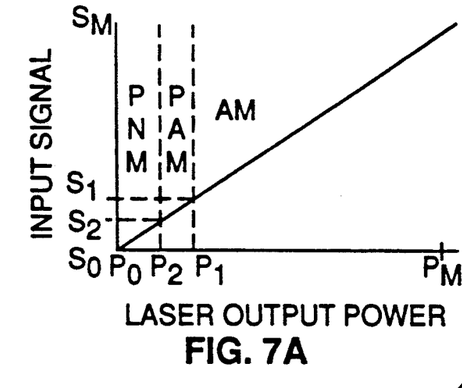
FIGS. 7A and 7B are input signal versus laser output curves useful in explaining the operation of the respective embodiments shown in FIGS. 8A and 8B.

As shown in FIG. 7A in one embodiment of the invention, when the input digital signal from source 12 has a value in a first range of values which is Greater than a first transition value $S_1$, the laser diode 16 is controlled by laser control 14 so that the input signal directly modulates laser diode 16 to produce an amplitude modulated laser beam. When the input signal from source 12 has a value in a second range of values which is equal to or less than the first predetermined transition value $S_1$ but which is above a second lower predetermined transition value $S_2$, then laser diode 16 is controlled by control 14 to operate in a pulse amplitude modulation mode at a laser power in the linear operating region.

When the input digital signal has a value in a third range of values below said second transition value $S_2$, the laser diode 16 is controlled by control 14 to operate in the linear region in a pulse number modulation mode.

Figure 7B:
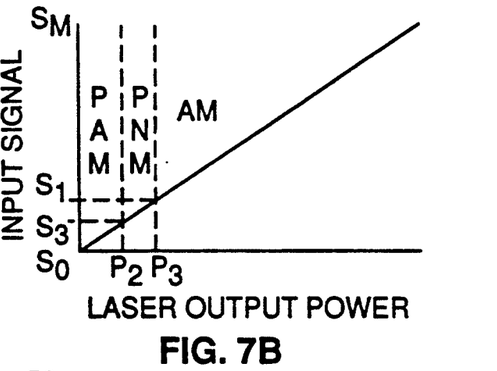

According to another embodiment of the invention as shown in FIG. 7B, when the digital image input signal has a value in a second lower range of values below the first transition value $S_1$, but above a second transition value $S_3$, the control means 14 controls laser diode 16 to operate in the linear region in a pulse number modulation mode. When the digital image input signal has a value in a third range of values below said second transition value, control means 14 controls laser diode 16 to operate in the linear region in a pulse amplitude mode.

Figure 8A:
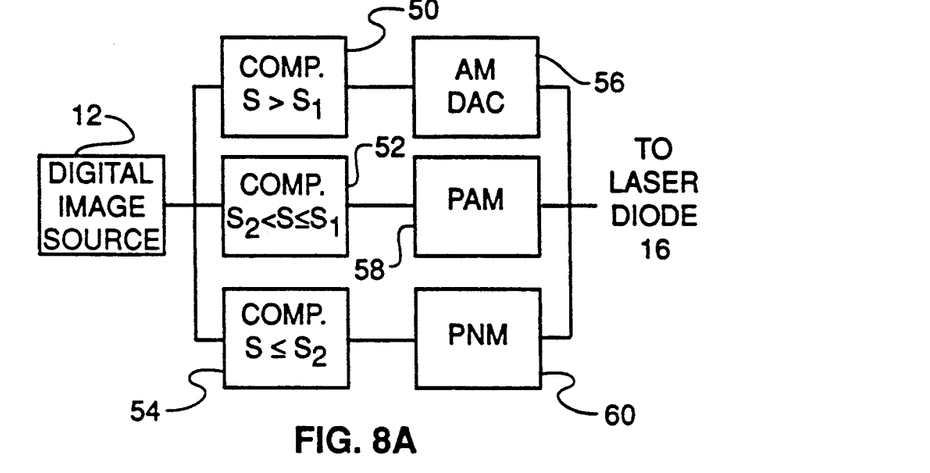
FIGS. 8A and 8B are block diagrams of another set of embodiments of the present invention.

FIG. 8A shows an embodiment of laser control 14 for controlling laser diode 16. As illustrated in FIG. 7A, laser control 14 includes comparators 50, 52 and 54, AM digital to analog converter (DAC) 56, pulse amplitude modulator (PAM) circuit 58 and pulse number modulator circuit (PNM) 60. Comparator 50 controls DAC 56 to modulate laser diode 16 in an AM mode when the digital signal S from source 12 has a value greater than $S_1$. Comparator 52 controls PAM circuit 58 to modulate laser diode 16 in a pulse amplitude modulation mode when the digital signal from source 12 is less than or equal to $S_1$, but greater than $S_2$. Comparator 54 controls PNM circuit 60 to modulate laser diode 16 in a pulse number mode when the digital signal from source 12 is less than or equal to $S_2$.

Figure 9A:
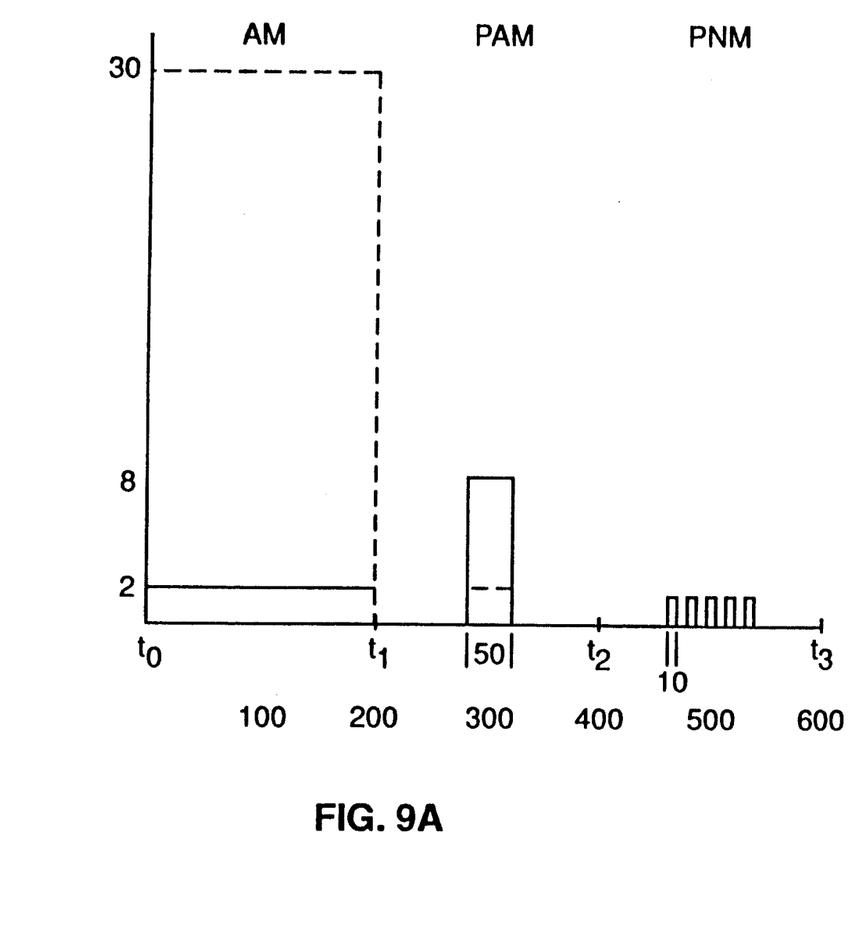
FIGS. 9A and 9B are graphical views useful in understanding the operation of the respective embodiments of FIGS. 8A and 8B.

The control signal used to control laser diode 16 is illustrated in FIG. 9A. During the pixel period, $t_0 \rightarrow t_1$, the signal from source 12 is greater than $S_1$ and therefore the control signal is a linear function of the input signal and amplitude modulates the laser diode 16. During the pixel period $t_1 \rightarrow t_2$, the control signal pulse amplitude modulates the laser diode 16. During the period $t_2 \rightarrow t_3$, the control signal pulse width modulates the laser diode 16.

Figure 8B:
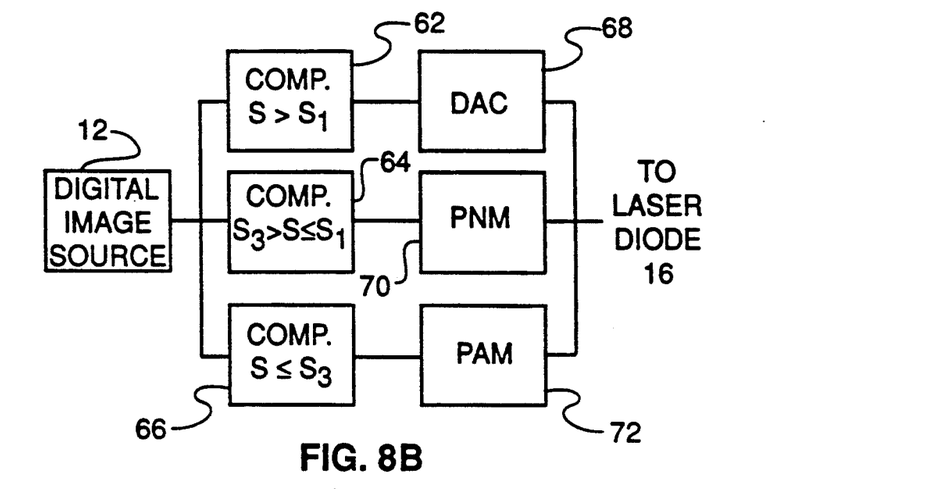

In the embodiment of FIG. 8B, laser control 14 includes comparators 62, 64 and 66, amplitude modulation (AM) DAC 68, PNM circuit 70 and PAM circuit 72. Comparator 62 controls AM DAC 68 when the input digital signal S is greater than $S_1$, comparator 64 controls PNM circuit 70 when the input digital signal S is less than or equal to $S_1$ but greater than $S_3$, and comparator 66 controls PAM circuit 72 when the input digital signal S is less than or equal to $S_3$.

Figure 9B:
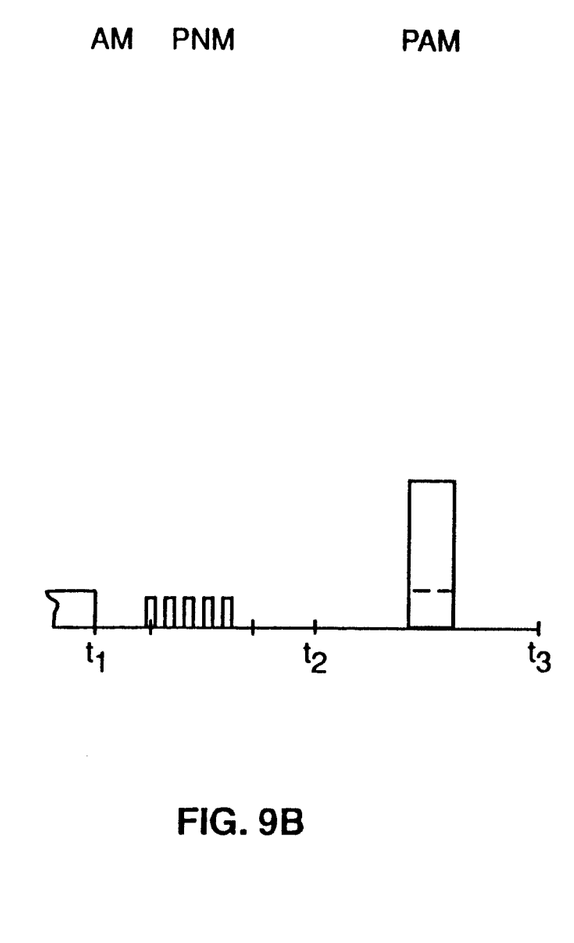

The control signal used to control laser diode 16 is illustrated in FIG. 9B. During the pixel period, $t_0 \rightarrow t_1$, when the signal S is greater than $S_1$, the control signal amplitude modulates laser diode 16. During the pixel period $t_1 \rightarrow t_2$, when the signal S is between $S_1$ and $S_3$, the control signal pulse number modulates laser diode 16, when the signal S is less than $S_3$, the control signal pulse amplitude modulates laser diode 16.

Figure 10:
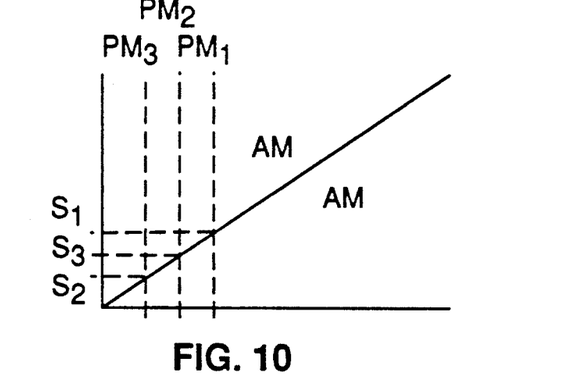
FIG. 10 is an input signal versus laser output curve useful in explaining the operation of the embodiment shown in FIG. 11.
Figure 11:
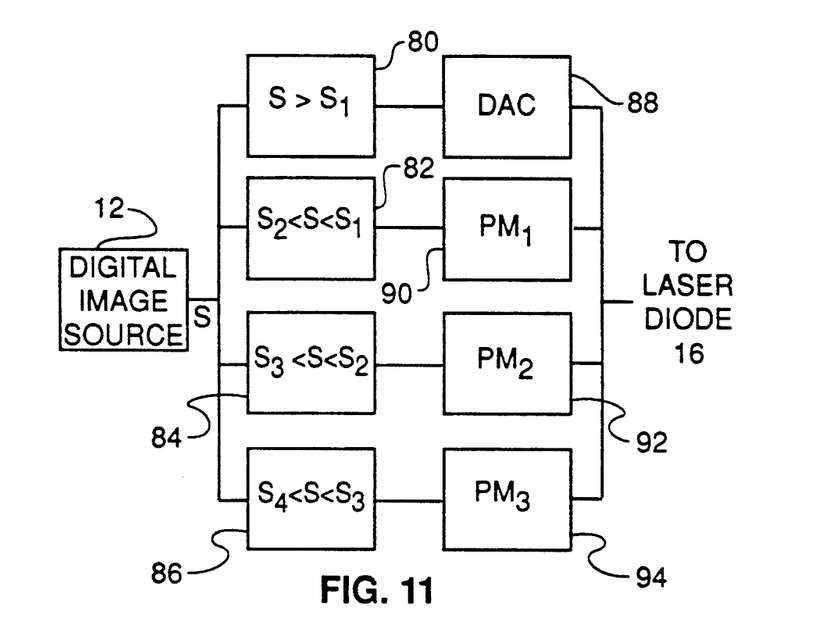
FIG. 11 is a block diagram of a further embodiment of the present invention.
Figure 12:
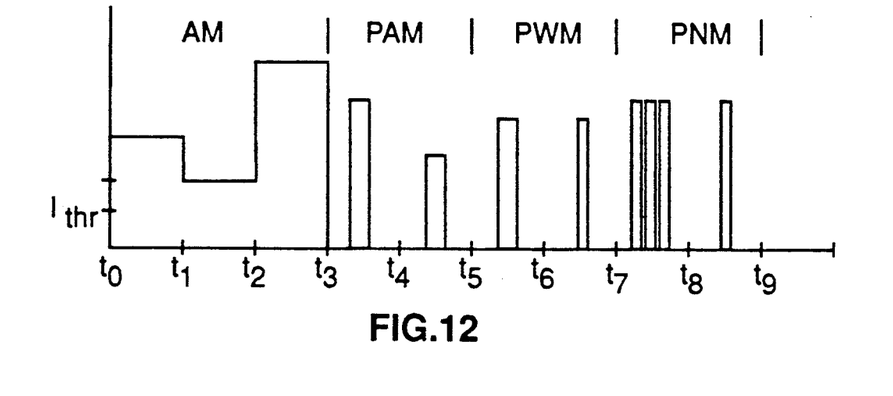
FIG. 12 is a graphical view useful in understanding the operation of the embodiment shown in FIG. 11.

Referring now to FIGS. 10, 11, and 12, there will be described another embodiment of the present invention. As shown in FIG. 10, when the input digital signal for source 12 has a range of values which is greater than a first transition value S1, the laser diode 16 is controlled by laser control 14 so that the input signal directly modulates laser diode 16 to produce an amplitude modulation signal. When the input digital signal from source 12 has a second range of values between first and second predetermined transition values $S_1$ and $S_2$, laser diode 16 is controlled by control 14 to operate in the linear region in a first pulse modulation mode $PM_1$ (to be explained later).

When the input digital signal from source 12 has a third range of values between second and third predetermined transition values $S_2$ and $S_3$, laser diode 16 is controlled by control 14 to operate in the linear region in a second pulse modulation mode $PM_2$. Finally, when the input digital signal from source 12 has a fourth range of values below the third predetermined transition value $S_3$, laser diode 16 is controlled by control 14 to operate in the linear region in a third pulse modulation mode $PM_3$. Pulse Modulation Modes $PM_1$, $PM_2$, and $PM_3$ are one of the following; pulse amplitude modulation(PAM) mode, pulse width modulation(PWM) mode, and pulse number modulation(PNM) mode. According to this embodiment of the invention, $PM_1$ can be any one of PAM, PNM, PWM modes, then $PM_2$ is another of the PAM, PNM, PWM modes, and $PM_3$ is the last of the PAM, PNM, PWM modes. For example, if $PM_1$ is operating in the PAM mode, $PM_2$ can operate in either the PNM or PWM modes (say the PWM mode) and $PM_3$ can operate in the other of the PNM and PWM modes (say the PNM mode).

FIG. 11 shows an embodiment of laser control 14 for controlling laser diode 16. Laser control 14 includes a comparator 80 which controls DAC 88, a comparator 82 which controls PM1 circuit 90, a comparator 84 Which controls PM2 circuit 92, and a comparator 86 which controls PM3 circuit 94. In order to understand the operation of laser control 14, let it be assumed that PM1 circuit 90 is a PAM circuit, that PM2 circuit 92 is a PWM circuit, and PM3 circuit 94 is a PNM circuit.

In such a case, the input digital signal S from source 12 is applied simultaneously to comparators 80, 82, 84, and 86. If S is greater than $S_1$, comparator 80 controls DAC 88 to operate laser diode 16 in the AM mode. If S is between $S_1$ and $S_2$, comparator 82 controls $PM_1$ circuit 90 to operate laser diode 16 in the PAM mode If S is between $S_2$ and $S_3$, comparator 84 controls $PM_2$ circuit 92 to operate in the PWM mode. If S is less than $S_3$, comparator 86 controls $PM_3$ circuit 94 to operate in the PNM mode. This operation is illustrated in FIG. 12. During the pixel periods $t_0-t_3$, laser diode 16 is operated in the AM mode, during the pixel periods $t_3-t_5$, laser diode 16 is operated in the PAM mode, during the pixel periods $t_5 \rightarrow t_7$, laser diode 16 is operated in the PWM mode, and during the pixel periods $t_7-t_9$, laser diode is operated in the PNM mode.

It should be clear from FIG. 12, that, during operation in each of these modes, the laser diode 16 is operated in the linear lasing region above the threshold current.

Figure 13:
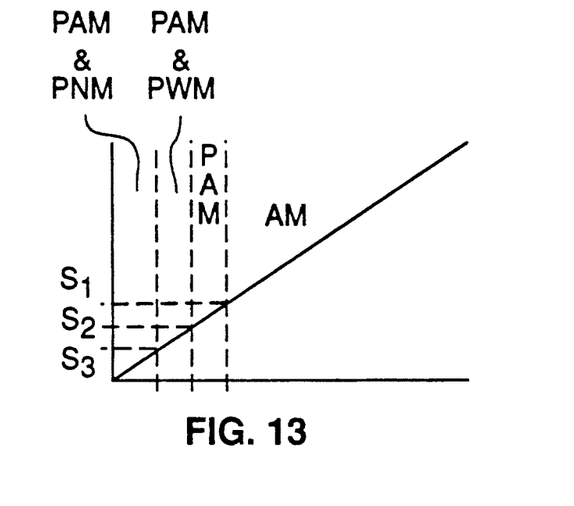
FIGS. 13 and 14 are graphical views useful in understanding the operation of a modification to the embodiment of FIG. 11.
Figure 14:
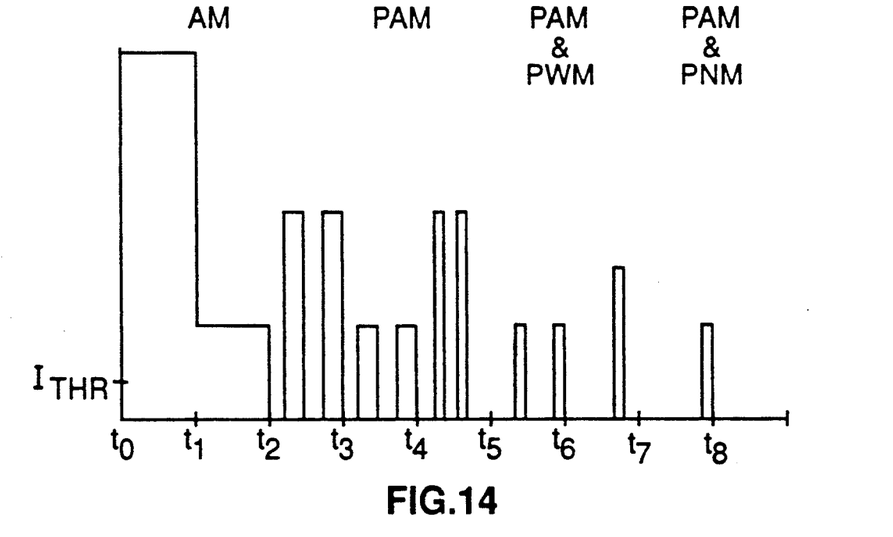

Referring now to FIGS. 13 and 14, there is illustrated another embodiment of the present invention. This embodiment is a modification of the latter embodiment. Instead of the pulse modulation modes being used separately in the three lower input signal ranges, the pulse modulation modes are combined. Thus, when the input signal is above $S_1$, laser diode 16 is operated in the AM mode (pixel periods $t_0-t_2$). When the input signal is between $S_1$ and $S_2$, laser diode 16 is operated in the PAM mode (pixel periods $t_2-t_4$). When the input signal is between $S_2$ and $S_3$, laser diode is operated in the combined PAM and PWM modes (pixel periods $t_4-t_6$). When the input signal is less than $S_3$, laser diode 16 is operated in the combined PAM and PNM modes.

Figure 15:
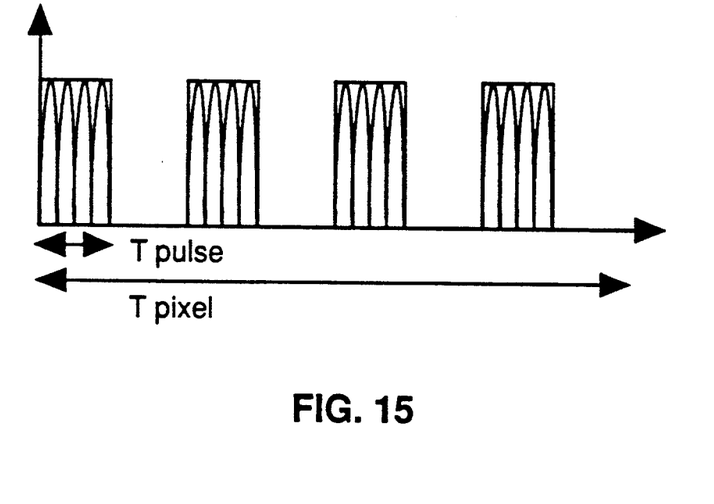
FIG. 15 is a diagrammatic view illustrating the RF injection technique.

The characteristics in the LED region can be improved in all of the embodiments by the use of the injection of an RF (Radio Frequency) signal, at an average level, into the laser diode 16. RF injection reduces laser beam divergence, and reduces the shift in wavelength typically observed at output illuminative powers close to and in the LED region of operation. It effectively extends the laser region of operation into the LED region by pumping the laser hard enough to sustain a population inversion at output powers which, without the use of RF injection would be in the LED region of operation. RF injection could be used to extend the contrast ratio initially used in the am mode, and in all of the pulse modulation modes. FIG. 15 illustrates the use of RF injection in a pulse.

If for example, a 30 milliwatt laser has a 2 milliwatt transition point, and RF injection extended the laser region of operation to 0.5 milliwatts, it would result in a factor of 4 improvement in operation and the contrast ratio would be improved from 15 to 60 using AM alone.

When using a single pulse in a pixel period, the pulsed laser beam profile may not have sufficient overlap with the adjacent pixel exposure to prevent sub-pixel density variations. When sub-pixel density variations appear in the same place in a number of adjacent lines, the resulting macroscopic effect is visible bands which are an objectionable image feature. Random distribution of the pulse location within the pixel period is used to prevent this undesirable effect.

The disclosed invention has industrial application in laser printers used in medical imaging systems.

Although the invention has been described with reference to preferred embodiments thereof, it will be understood that variations and modifications can be effected within the spirit and scope of the invention as described above and as defined in the appended claims.

What is claimed is:

1. A laser imaging apparatus comprising:
 a laser diode which is operable in a linear laser region and a lower nonlinear LED region;
 means for applying to said laser diode a digital image input signal having a first range of digital values which would operate said laser diode in said linear region and having second and third lower ranges of digital values below said first range of values which would operate said laser diode in said nonlinear region; and
 control means for controlling said laser diode to operate in an amplitude modulation mode in said linear operating region, when said digital image input signal has a value in said first range of digital values, to operate, in one of a pulse amplitude modulation mode (PAN), or a pulse width modulation (PWM) mode in said linear region, when said digital image input signal has a value in said second range of digital values, and to operate in the other of said PAN or PWM modes in said linear region when said digital input signal has a value in said third range of digital values.

2. The apparatus of claim 1 wherein said control means includes comparator means for comparing the value of said digital image input signal to first and second predetermined transition values, which delineate, respectively, said first and said second ranges of values and said second and said third ranges of values, such that, (a) when said compared value is greater than said first predetermined transition value, said laser diode is controlled to operate in said amplitude modulation mode; (h) when said compared value is less than said first predetermined transition value but greater than said second predetermined transition value, said laser diode is controlled to operate in said one of said PAM or PWM modes; and (c) when said compared value is less than said second predetermined transition value, said laser diode is controlled to operate in said other of said PAM or PWM modes.

3. A laser imaging apparatus comprising:
 a laser diode which is operable in a linear laser region and a lower nonlinear LED region;
 means for applying to said laser diode a digital image input signal having a first range of digital values which would operate said laser diode in said linear region and having second and third lower ranges of digital values below said first range of values which would operate said laser diode in said nonlinear region; and
 control means for controlling said laser diode to operate in an amplitude modulation mode in said linear operating region, when said digital image input signal has a value in said first range of values, to operate, in one of a pulse amplitude modulation mode (PAM), or a pulse number modulation (PNM) mode in said linear region, when said digital image input signal has a value in said second range of values, and to operate in the other of said PAM or PNM modes in said linear region when said digital input signal has a value in said third range of values.

4. The apparatus of claim 3 wherein said control means includes comparator means for comparing the value of said digital image input signal to first and second predetermined transition values, which delineate, respectively, said first and said second ranges of values and said second and said third ranges of values, such that, (a) when said compared value is greater than said first predetermined transition value, said laser diode is controlled to operate in said amplitude modulation mode; (b) when said compared value is less than said first predetermined transition value but greater than said second predetermined transition value, said laser diode is controlled to operate in said one of said PAM or PNM modes; and (c) when said compared value is less than said second predetermined transition value, said laser diode is controlled to operate in said other of said PAM or PNM modes.

5. A laser imaging apparatus comprising:
 a laser diode which is operable in a linear laser region and a lower nonlinear LED region;
 means for applying to said laser diode a digital image input signal having a first range of digital values which would operate said laser diode in said linear region and having second, third, and fourth lower ranges of digital values below said first range of values which would operate said laser diode in said nonlinear region; and
 control means for controlling said laser diode to operate in an amplitude modulation mode in said linear operating region, when said digital image input signal has a value in said first range of values, to operate, in one of a pulse amplitude modulation mode (PAM), a pulse width mode (PWM),or a pulse number modulation (PNM) mode in said linear region, when said digital image input signal has a value in said second range of values, to operate in another of said PAM, PWM or PNM modes in said linear region when said digital input signal has a value in said third range of values, and to operate in the last of said PAM, PWM, and PNW modes in said linear region, when said digital image input signal is in said fourth range of values.

6. The apparatus of claim 5 wherein said control means includes comparator means for comparing the value of said digital image input signal to first, second, and third predetermined transition values, which delineate, respectively, said first and said second ranges of values, said second and said third ranges of values, and said third and fourth ranges of values such that, (a)

when said compared value is greater than said first predetermined transition value, said laser diode is controlled to operate in said amplitude modulation mode; (b) when said compared value is less than said first predetermined transition value but greater than said second predetermined transition value, said laser diode is controlled to operate in said one of said PAM, PWM or PNM modes; (c) when said compared value is less than said second predetermined transition value, but greater than said third predetermined threshold value, said laser diode is controlled to operate in said another of said PAM, PWM or PNM modes; and (d) when said compared value is less than said third predetermined transition value, said laser diode is controlled to operate in said last of said PAM, PWM, or PNW modes .

7. The apparatus of claim 5 wherein when said digital image input signal is in one or more of said second, third or fourth range of values, said laser diode is controlled by said control means to operate in combined pulse modulation modes.

* * * * *